(12) United States Patent
Senou

(10) Patent No.: US 7,944,766 B2
(45) Date of Patent: May 17, 2011

(54) SENSE AMPLIFIER AND SEMICONDUCTOR MEMORY DEVICE HAVING SENSE AMPLIFIER

(75) Inventor: Takefumi Senou, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 62 days.

(21) Appl. No.: 12/562,280

(22) Filed: Sep. 18, 2009

(65) Prior Publication Data
US 2010/0067318 A1 Mar. 18, 2010

(30) Foreign Application Priority Data
Sep. 18, 2008 (JP) .................................. 2008-238842

(51) Int. Cl.
*G11C 7/02* (2006.01)
(52) U.S. Cl. .................... 365/207; 365/196; 365/189.07; 365/189.05; 365/191
(58) Field of Classification Search .................. 365/207, 365/196, 189.07, 189.05, 191
See application file for complete search history.

(56) References Cited

U.S. PATENT DOCUMENTS
2006/0262621 A1* 11/2006 Forbes .......................... 365/205

FOREIGN PATENT DOCUMENTS
JP 2002-083497 3/2002
JP 2003-173685 6/2003

* cited by examiner

*Primary Examiner* — Thong Q Le
(74) *Attorney, Agent, or Firm* — Young & Thompson

(57) ABSTRACT

A sense amplifier comprises: a differential amplifier circuit configured to generate an amplified signal depending on a difference in voltage between bit lines; an output circuit receiving the amplified signal; and a load. The differential amplifier circuit comprises: a first output node supplying the amplified signal to the output circuit; and a second output node symmetrically placed with respect to the first output node and connected to the load. The output circuit comprises an output terminal for outputting an output signal generated based on the amplified signal. In response to a control signal, the load switches between a first capacitance value with which an offset voltage at the output terminal becomes a first voltage and a second capacitance value with which the offset voltage becomes a second voltage.

9 Claims, 9 Drawing Sheets

Fig. 1

101: SENSE AMPLIFIER

COMMON BIT LINE (READ)

T4, T5, T6, T7, T8, T9, T10, T11, T12, T13

Na, Nb

SAOUT — Iv6 — SENSE AMPLIFIER OUTPUT

SALOUT — Iv5 — OUTPUT OPEN

READ CONTROL SIGNAL

SENSE AMPLIFIER AND SEMICONDUCTOR MEMORY DEVICE HAVING SENSE AMPLIFIER

INCORPORATION BY REFERENCE

This application is based upon and claims the benefit of priority from Japanese patent application No. 2008-238842, filed on Sep. 18, 2008, the disclosure of which is incorporated herein in its entirety by reference.

BACKGROUND OF THE INVENTION

1. Field of the Invention

The present invention relates to a sense amplifier and a semiconductor memory device having the sense amplifier.

2. Description of Related Art

With improvement in a semiconductor technology, a semiconductor memory device in which increase in a chip area is suppressed and amount of memory is increased has been widely prevalent. A semiconductor memory device has a plurality of memory cells. Each memory cell stores one bit that is the minimum unit of information. For suppressing increase in the chip area and increasing the amount of memory, each memory cell has been miniaturized such that memory cells can be placed densely within a predetermined region.

It's often the case that amplitude of a signal output from the miniaturized memory cell is small. In order to amplify the signal having small amplitude, the semiconductor memory device such as a DRAM (Dynamic RAM) and an SRAM (Static RAM) is provided with a sense amplifier. The sense amplifier amplifies the small-amplitude signal read out from the memory cell to a level that a logic circuit outside of the semiconductor memory device can deal with.

In recent years, most of the semiconductor memory devices are provided with a sense amplifier having a differential amplifier circuit (hereinafter referred to as a "differential sense amplifier"). A current mirror type sense amplifier and a latch type sense amplifier are known as a typical differential sense amplifier. Such a differential sense amplifier generates an amplified signal by amplifying the signal read out from the memory cell based on a difference in voltage between a pair of two signal lines. In recent years, a power supply voltage of the semiconductor integrated circuit is lowered, and many semiconductor memory devices are provided with the latch type sense amplifier that can operate with a low power supply voltage, has no DC current path and thus enables low power consumption.

With regard to the sense amplifier installed in the semiconductor memory device, it is required to correctly read the memory cell data even if the difference in voltage between the two signal lines is small. Moreover, a high-speed operation is required. Furthermore, a small size and low power consumption are required. In order to configure a sense amplifier that can correctly read the memory cell data even if the difference in voltage between the two signal lines is small, it is known to be effective to reduce an offset voltage. To reduce the offset voltage of the sense amplifier is also effective for speeding up the operation, because no error read occurs when an operating start time of the sense amplifier is made earlier. A technique of reducing the offset voltage of the sense amplifier is described, for example, in Japanese Laid-Open Patent Application JP-2003-173685 and Japanese Laid-Open Patent Application JP-2002-083497.

In general, the offset voltage of the sense amplifier can be expressed as synthesis of a systematic offset component and a random offset component. Here, the systematic offset is a phenomenon that the offset voltages of all sense amplifiers shift to the same one side due to circuit design asymmetry between differential pairing. On the other hand, the random offset is caused by various factors mainly due to manufacturing variability (e.g. variation in the number of ions injected, variation in a size of a fabricated gate electrode, and the like) and takes a random value with respect to each sense amplifier. A frequency distribution of the random offset voltages for a large number of sense amplifiers is approximated by the Gaussian distribution.

FIG. 1 is a circuit diagram showing a configuration of a latch type sense amplifier 101 disclosed in Japanese Laid-Open Patent Application JP-2003-173685. In the sense amplifier 101, bit lines constituting a complementary bit line pair connected to a memory cell are respectively connected to gates of a NMOS (n-channel MOS) transistor T9 and a NMOS transistor T11. Moreover, a pair of a PMOS (p-channel MOS) transistor T5 and a PMOS transistor T6 and a pair of a NMOS transistor T10 and a NMOS transistor T12 are so connected as to form a latch circuit and to achieve the amplification function. The transistors constituting the transistor pair are symmetrically placed in order to prevent imbalance between the transistors due to difference in pattern. Also, those transistors are typically designed to be larger in size as compared with transistors used in a normal logic circuit in order to reduce random variation in device characteristics.

A PMOS transistor T4 and a PMOS transistor T7 are precharge transistors used for setting internal nodes Na and Nb of the sense amplifier 101 to high potential prior to the amplification operation. A PMOS transistor T8 is an equalizer transistor used for securing potential equilibrium between the internal nodes Na and Nb of the sense amplifier 101 prior to the amplification operation.

A NMOS transistor T13 functions as an activation switch for operating the sense amplifier. When the NMOS transistor T13 is turned ON, a small potential difference input to the NMOS transistor T9 and the NMOS transistor T11 is amplified to the power supply voltage and then output to the outside of the sense amplifier through an inverter Iv6.

As shown in FIG. 1, the latch type sense amplifier 101 further has an inverter Iv5 whose output is open and which is symmetrically placed with respect to the inverter Iv6. The inverter Iv5 secures layout symmetry and thereby suppresses occurrence of the systematic offset due to imbalance in electrostatic capacitance between the differential pairing. In the case of the latch type sense amplifier 101 shown in FIG. 1, the capacitance balance is secured by placing the inverter Iv5 that has the same input capacitance as of the inverter Iv6.

Japanese Laid-Open Patent Application JP-2002-083497 discloses a technique related to a semiconductor integrated circuit and intended to reduce influence of the offset voltage when a voltage depending on a potential difference between the first and second signal lines is amplified and output. According to the technique, a bit line voltage is adjusted depending on an offset voltage of a flip-flop and thereby a voltage depending on a potential difference between bit lines is output without being influenced by the offset voltage of the flip-flop.

The inventor of the present application has recognized the following points. In the sense amplifier applied to the semiconductor memory device, it is important to design the offset voltage as small as possible. As described above, to use a large element is preferable for reducing the random offset caused by the manufacturing variability. Moreover, in order to reduce the systematic offset, it is preferable to design the layout as symmetric as possible between the differential pairing.

According to the technique described in Japanese Laid-Open Patent Application JP-2003-173685, for example, the inverter (Iv5) that is a dummy element irrelevant to a logic operation is placed for reducing the imbalance in capacitance between the differential pairing. Even in this case, however, the variation in device characteristics due to variation in a size of a fabricated gate electrode, variation in the number of ions injected, non-uniformity of manufacturing conditions and the like is inevitable in principle. Thus, there is a limit to the reduction of the offset voltage of the sense amplifier. In the case of Japanese Laid-Open Patent Application JP-2002-083497 where the bit line voltage is adjusted depending on the offset voltage of the flip-flop, high-speed operation is difficult to achieve, which is disadvantageous.

SUMMARY

In one embodiment of the present invention, a sense amplifier has: a differential amplifier circuit configured to generate an amplified signal depending on a difference in voltage between a first input signal and a second input signal; an output circuit connected to the differential amplifier circuit and receiving the amplified signal; and a load connected to the differential amplifier circuit. The differential amplifier circuit has: a first output node supplying the amplified signal to the output circuit; and a second output node symmetrically placed with respect to the first output node and connected to the load. The output circuit has an output terminal for outputting an output signal generated based on the amplified signal. The load is configured to switch between a first capacitance value with which an offset voltage at the output terminal becomes a first voltage and a second capacitance value with which the offset voltage becomes a second voltage and to shift the offset voltage from the first voltage to the second voltage by switching from the first capacitance value to the second capacitance value in response to a control signal.

In another embodiment of the present invention, a semiconductor memory device has: a plurality of memory cells; and a sense amplifier configured to amplify a signal read out from at least one of the plurality of memory cells. The sense amplifier has: a differential amplifier circuit configured to generate an amplified signal depending on a difference in voltage between a first input signal and a second input signal; an output circuit connected to the differential amplifier circuit and receiving the amplified signal; and a load connected to the differential amplifier circuit. The differential amplifier circuit has: a first output node supplying the amplified signal to the output circuit; and a second output node symmetrically placed with respect to the first output node and connected to the load. The output circuit has an output terminal for outputting an output signal generated based on the amplified signal. The load is configured to switch between a first capacitance value with which an offset voltage at the output terminal becomes a first voltage and a second capacitance value with which the offset voltage becomes a second voltage and to shift the offset voltage from the first voltage to the second voltage by switching from the first capacitance value to the second capacitance value in response to a control signal.

The systematic offset component is intentionally designed to be one polarity, while the offset voltage is switchable to the other polarity depending on the random offset component. More specifically, the capacitance load is switchable depending on the random offset component of each manufactured sense amplifier. After the sense amplifier is manufactured, the capacitance load is selected depending on the manufactured offset voltage so as to reduce variation of the offset voltage.

According to the present invention, it is possible to easily and effectively reduce the offset of the sense amplifier. It is possible to achieve a sense amplifier having a smaller offset variation. It is possible to design a high-speed semiconductor memory device having a wide operation margin.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 1 is a circuit diagram showing a configuration of a typical latch type sense amplifier;

DESCRIPTION OF PREFERRED EMBODIMENTS

Figure 2:
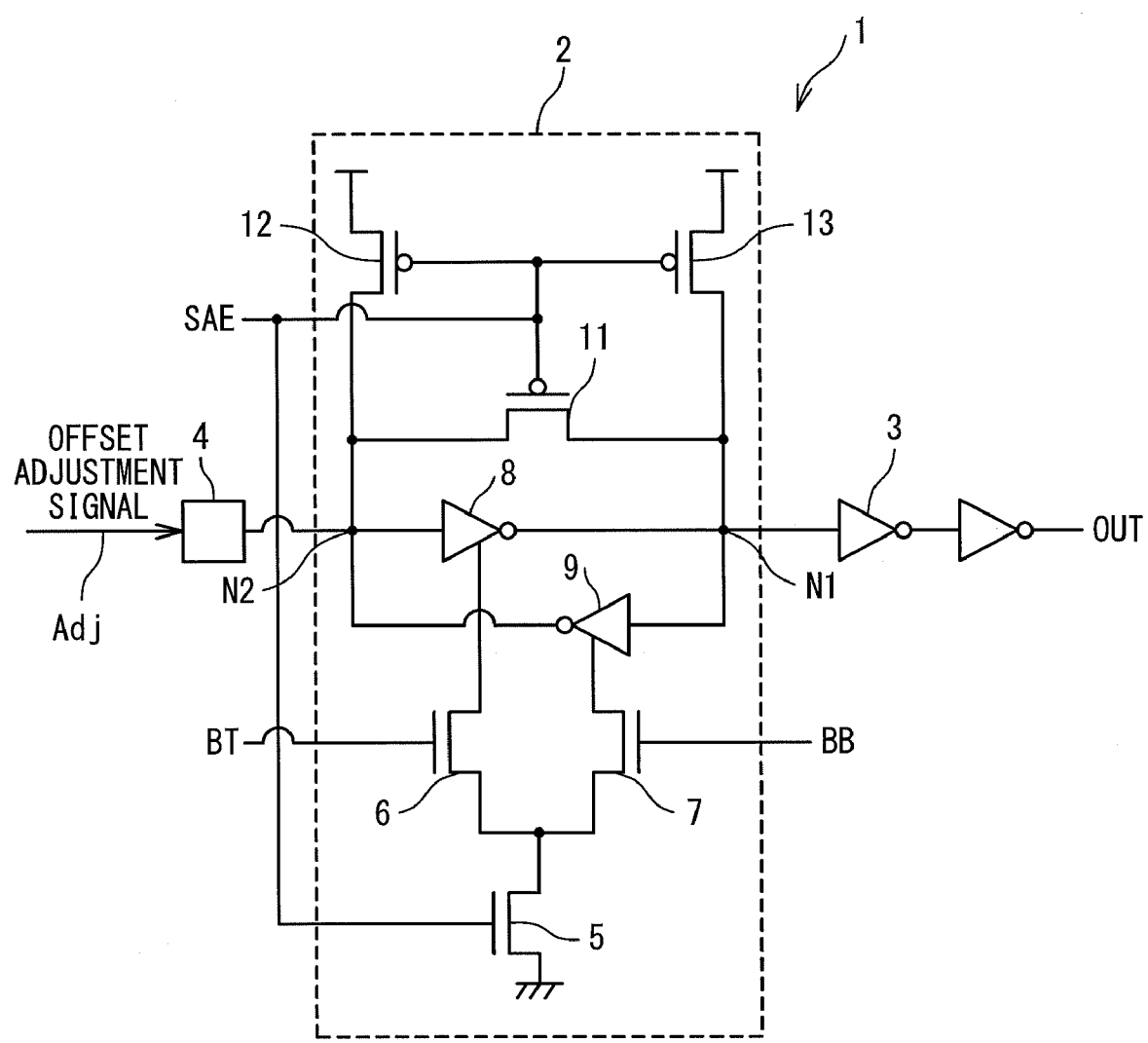
FIG. 2 is a circuit diagram showing a configuration example of a sense amplifier according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed. It should be noted that the same reference numerals are given to the same components and an overlapping description will be omitted as appropriate.

First Embodiment

FIG. 2 is a circuit diagram showing a configuration example of a sense amplifier 1 according to a first embodiment of the present invention. The sense amplifier 1 is applied to a semiconductor memory device such as a DRAM and the like. The semiconductor memory device has a plurality of memory cells. The sense amplifier 1 amplifies a signal read out from at least one of the plurality of memory cells. More specifically, the sense amplifier 1 has a differential amplifier circuit 2, an output circuit 3 and a dummy load 4.

The differential amplifier circuit 2 has a switch transistor 5, a first differential transistor 6, a second differential transistor 7, a first inverter 8, a second inverter 9, a first PMOS transistor 11, a second PMOS transistor 12 and a third PMOS transistor 13. A sense amplifier enable signal SAE output from a read/write control circuit (not shown) is supplied to gates of the first to third PMOS transistors 11 to 13. The sense amplifier enable signal SAE is also supplied to a gate of the switch transistor 5.

A gate of the first differential transistor 6 is connected to one common bit line BT for use in data reading, and a first input signal is input to the gate of the first differential transistor 6 through the bit line BT. A gate of the second differential transistor 7 is connected to the other common bit line BB for use in data reading, and a second input signal is input to the gate of the second differential transistor 7 through the bit line BB.

The first inverter 8 and the second inverter 9 are so connected as to constitute a latch circuit in the differential amplifier circuit 2. That is, an output terminal of the first inverter 8 is connected to an input terminal of the second inverter 9 through a first node (first output node) N1. Moreover, an output terminal of the second inverter 9 is connected to an input terminal of the first inverter 8 through a second node (second output node) N2. The differential amplifier circuit 2 is configured to have a symmetric property. For example, the second node N2 is symmetrically placed with respect to the first node N1.

The differential amplifier circuit 2 thus configured generates an amplified signal depending on a difference in voltage between the first input signal (bit line BT) and the second input signal (bit line BB). The first node N1 is connected to the output circuit 3 and supplies the amplified signal to the output circuit 3. On the other hand, the second node N2 is connected to the dummy load 4.

The output circuit 3 is for outputting data from the sense amplifier 1. An input terminal of the output circuit 3 is connected to the above-mentioned first node N1 of the differential amplifier circuit 2. The output circuit 3 receives the amplified signal from the differential amplifier circuit 2. An output signal OUT generated based on the amplified signal is output from an output terminal of the output circuit 3.

The dummy load 4 is connected to the differential amplifier circuit 2. More specifically, an input terminal of the dummy load 4 is connected to the above-mentioned second node N2. An output terminal of the dummy load 4 is Open without being connected to anything. According to the present embodiment, the dummy load 4 and the output circuit 3 are designed to be asymmetric with each other. Furthermore, the dummy load 4 has a function of switching the offset voltage at the output terminal of the sense amplifier 1 in response to an offset adjustment signal Adj (control signal, capacitance select bit).

Figure 3:
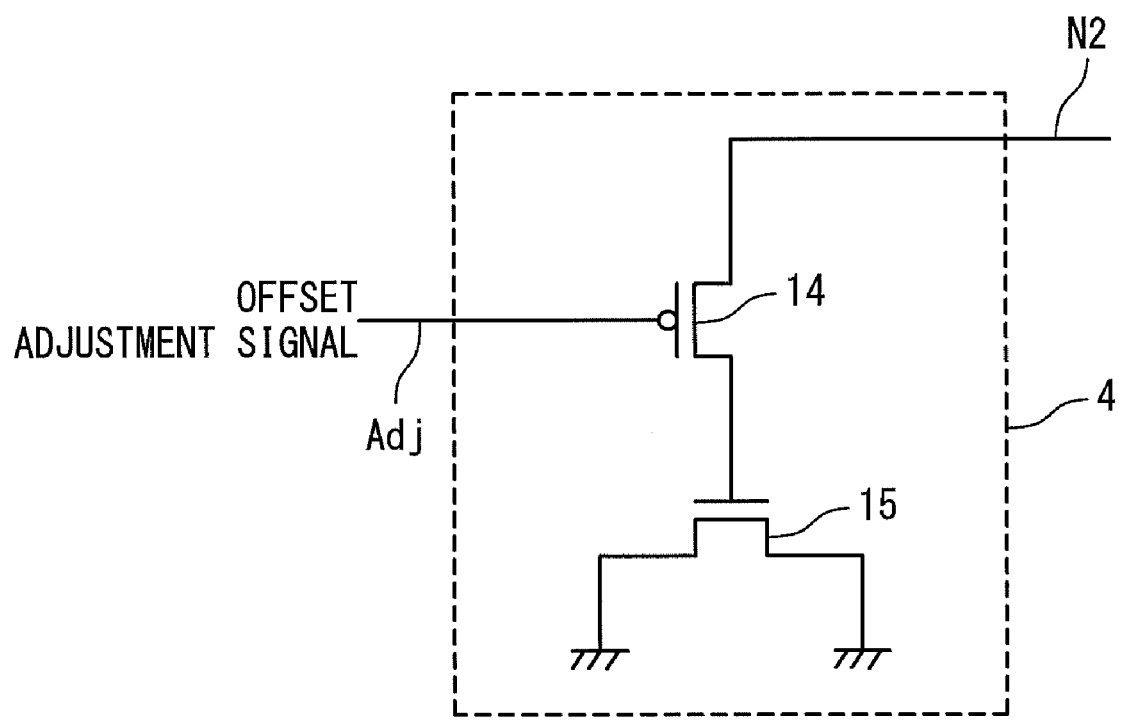
FIG. 3 is a circuit diagram showing a configuration example of a dummy load in the present embodiment.
Figure 4:
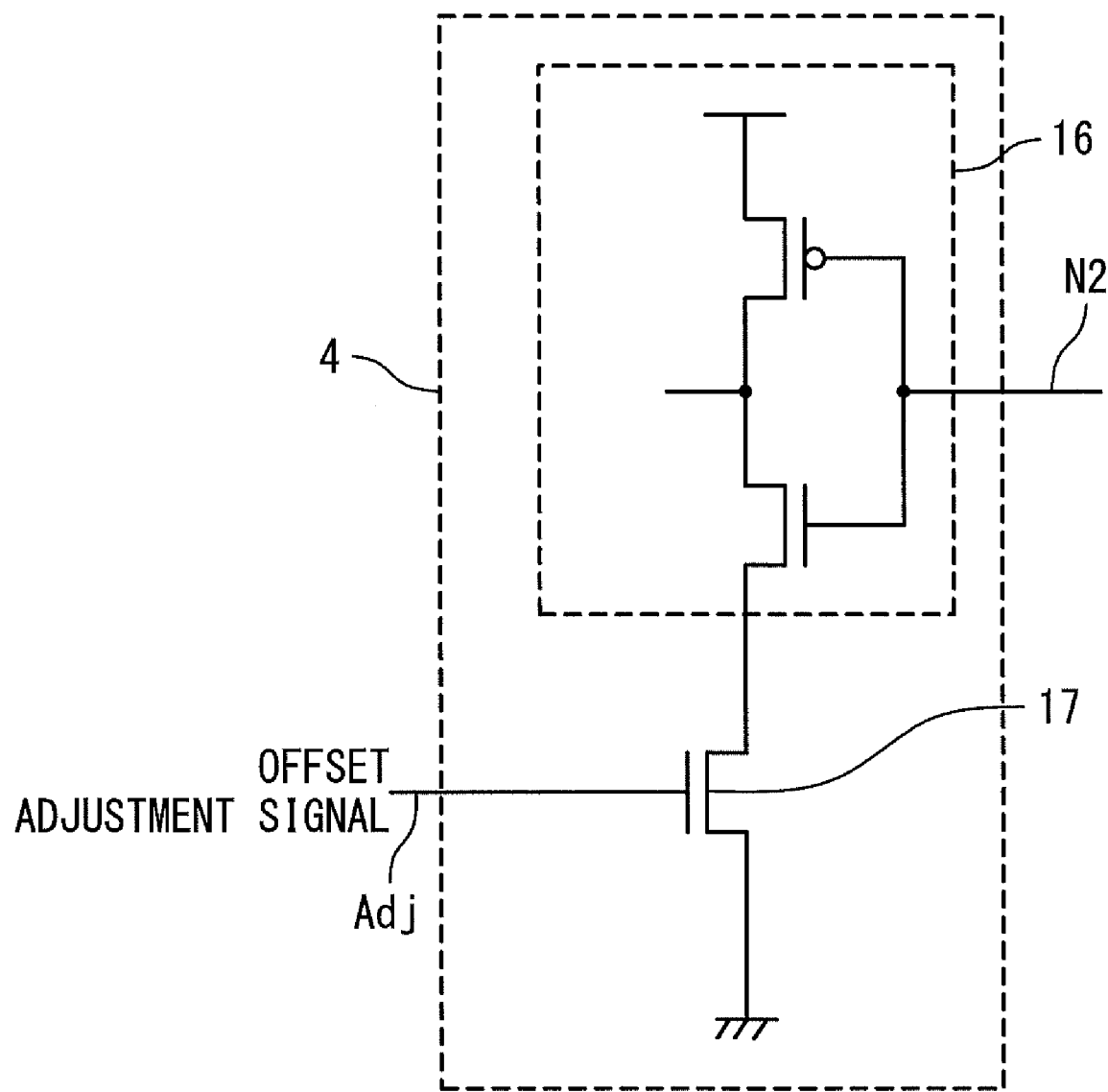
FIG. 4 is a circuit diagram showing another configuration example of the dummy load in the present embodiment.

FIG. 3 is a circuit diagram showing a configuration example of the dummy load 4 in the present embodiment. As shown in FIG. 3, the dummy load 4 includes an offset switch circuit 14 and a MOS capacitor 15. The offset switch circuit 14 is activated in response to the offset adjustment signal Adj. A ground terminal of the offset switch circuit 14 is connected to a gate of the MOS capacitor 15. A source and a drain of the MOS capacitor 15 are connected to the ground and shorted to each other. FIG. 4 is a circuit diagram showing another configuration example of the dummy load 4 in the present embodiment. As shown in FIG. 4, the dummy load 4 includes an inverter 16 and an offset switch circuit 17. The offset switch circuit 17 is activated in response to the offset adjustment signal Adj.

The dummy load 4 thus configured can switch between a first capacitance value and a second capacitance value depending on the offset adjustment signal Adj (capacitance select bit). In the case of the first capacitance value, the offset voltage of the sense amplifier 1 becomes a first voltage. In the case of the second capacitance value, the offset voltage of the sense amplifier 1 becomes a second voltage. Thus, the dummy load 4 can shift the offset voltage of the sense amplifier 1 from the first voltage to the second voltage by switching from the first capacitance value to the second capacitance value in response to the offset adjustment signal.

The dummy load 4 in the present embodiment is not limited to those shown in FIGS. 3 and 4. The dummy load 4 shown in FIG. 3 consists of two transistors. The dummy load 4 shown in FIG. 4 consists of three transistors wherein an additional NMOS transistor is series-connected to the NMOS transistor of the inverter 16. Alternatively, electrostatic capacitance generated between metal wirings can be used. In any case, the dummy load 4 in the present embodiment consists of a small number of elements, which is preferable. Note that the transistor size in the dummy load 4 is preferably determined such that a frequency distribution of the offset voltage totally shifts in response to the offset adjustment signal (capacitance select bit) Adj.

Figure 5:
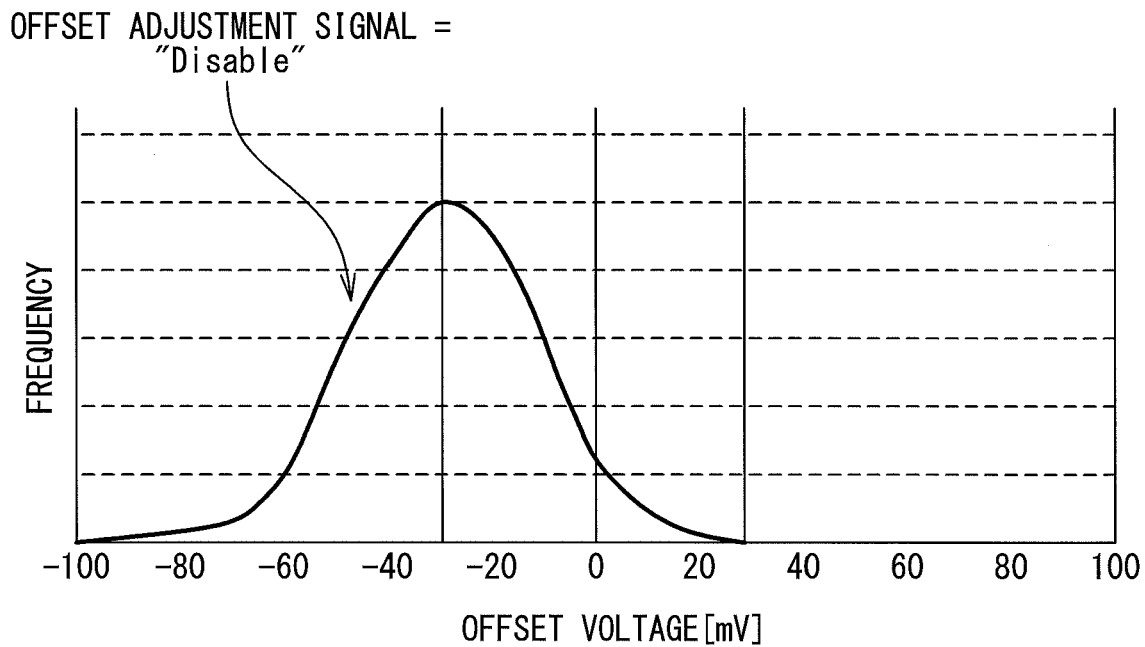
FIG. 5 is a graph showing an example of a distribution of offset voltages for a plurality of sense amplifiers in a case where an offset adjustment signal Adj is "Disable"

FIG. 5 is a graph showing an example of a distribution (variation) of the offset voltages for a plurality of sense amplifiers 1 in a case where the offset adjustment signal Adj is "Disable" and the offset voltage is the first voltage. An average value (center value) of the distribution of the offset voltages corresponds to the systematic offset in this case, which is hereinafter referred to as a "first average offset value". The capacitance (first capacitance) of the dummy load 4 in the case where the offset adjustment signal Adj is "Disable" is designed such that the first average offset value is on the minus side of 0 mV, as shown in FIG. 5. In other words, the dummy load 4 is configured to have the first capacitance smaller than an input capacitance of the output circuit 3. In this manner, the first average offset value corresponding to the systematic offset is intentionally designed to be lower than 0 mV. In the case of the example shown in FIG. 5, the first average offset value (systematic offset) is designed to be −30 mV.

Figure 6:
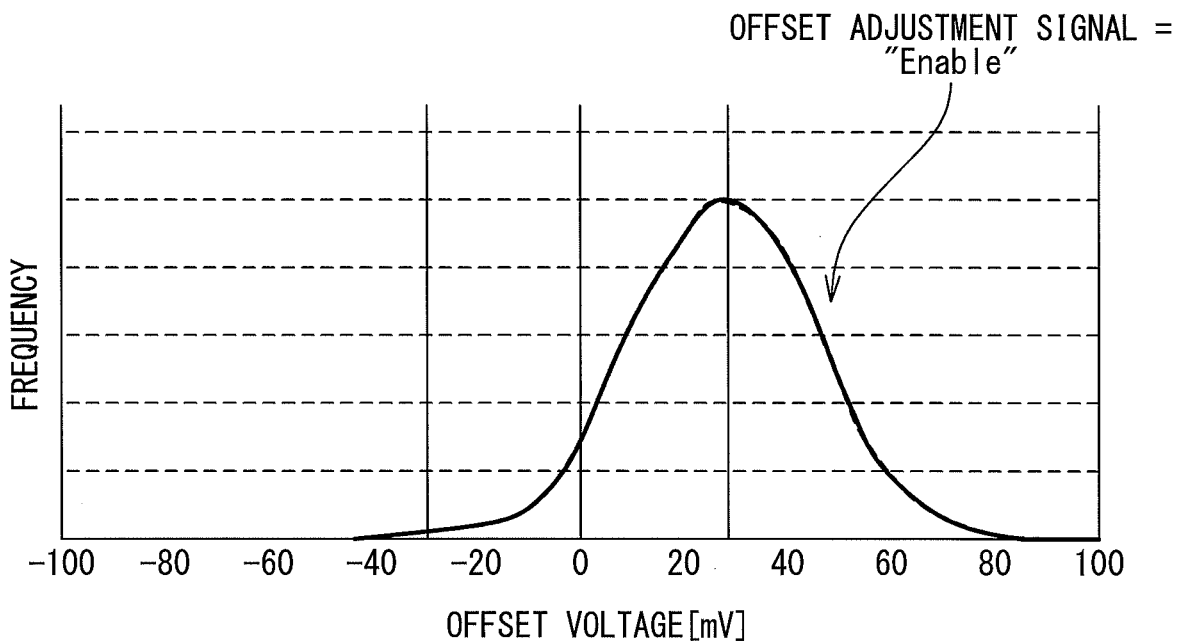
FIG. 6 is a graph showing an example of a distribution of offset voltages for the plurality of sense amplifiers in a case where the offset adjustment signal Adj is "Enable"

FIG. 6 is a graph showing an example of a distribution (variation) of the offset voltages for the plurality of sense amplifiers 1 in a case where the offset adjustment signal Adj is "Enable" and the offset voltage is the second voltage. An average value (center value) of the distribution of the offset voltages corresponds to the systematic offset in this case, which is hereinafter referred to as a "second average offset value". The capacitance (second capacitance) of the dummy load 4 in the case where the offset adjustment signal Adj is "Enable" is designed such that the second average offset value is on the plus side of 0 mV, as shown in FIG. 6. In other words, the dummy load 4 is configured to have the second capacitance larger than the input capacitance of the output circuit 3. In this manner, the second average offset value corresponding to the systematic offset is designed to be higher than 0 mV. In the case of the example shown in FIG. 6, the second average offset value (systematic offset) is designed to be +30 mV.

As described above, the first average offset value and the second average offset value are symmetric with respect to 0 mV. A difference between the second average offset value and the first average offset value is an offset correction voltage, which is 60 mV in the above example. A difference between the first voltage and the second voltage is equal to the offset correction voltage. The dummy load 4 is configured such that the offset voltage (systematic offset) of the sense amplifier 1 shifts by the offset correction voltage when the offset adjustment signal Adj is switched from "Disable" to "Enable". The frequency distribution shown in FIG. 6 can be obtained by totally shifting the frequency distribution shown in FIG. 5 toward the positive direction by the offset correction voltage.

Figure 7:
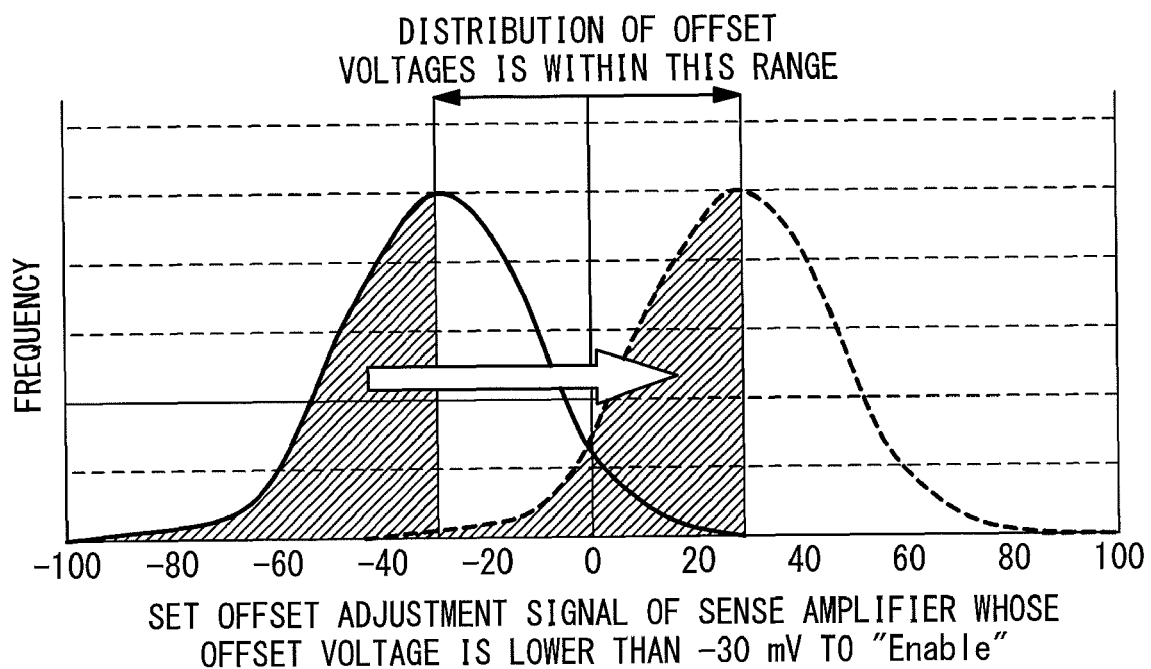
FIG. 7 is a graph for explaining an operation example of a semiconductor memory device having the sense amplifier according to the present embodiment.

FIG. 7 is a graph for explaining an operation example of the semiconductor memory device having the sense amplifier 1 according to the present embodiment. In the semiconductor memory device having the sense amplifier 1 according to the present embodiment, the offset adjustment signal Adj is first set to "Disable" and then a test of the semiconductor memory device is performed. If the offset voltage of a certain sense amplifier 1 is outside a range between the first average offset value and the second average offset value, namely, if the offset voltage of a certain sense amplifier 1 is detected to be lower than −30 mV, the certain sense amplifier 1 is judged as "FAIL" and a fail bit of the certain sense amplifier 1 is set to "1".

After that, the offset adjustment signal Adj supplied to the sense amplifier 1 whose fail bit is "1" is set to "Enable" and then a retest of the semiconductor memory device is performed. If the sense amplifier 1 passes the retest, it means that the offset voltage of the sense amplifier 1 becomes smaller when the offset adjustment signal Adj is set to "Enable". Therefore, when the semiconductor memory device is actually used, the offset adjustment signal Adj supplied to this sense amplifier 1 is set to "Enable". Once the offset adjustment signal Adj is thus set, the sense amplifier 1 can operate with the smaller offset voltage.

In the sense amplifier 1 according to the present embodiment, there is no need to design the differential pairing to be completely symmetric to make the systematic offset voltage 0 mV. Instead, according to the sense amplifier 1 of the present embodiment, the dummy load 4 is configured such that the systematic offset voltage when the offset adjustment signal Adj is "Disable" is displaced to the minus side. In other words, the output circuit 3 and the dummy load 4 are intentionally designed to be imbalanced.

If the random offset component of a sense amplifier 1 is on the plus side as a result of the manufacturing, the offset voltage (sum of the systematic offset and the random offset) thereof becomes smaller because the systematic offset at this time is on the minus side. That is, the offset voltage (sum of the systematic offset and the random offset) thereof is within a range between the first average offset value (−30 mV) and the second average offset value (+30 mV). In this case, there is no need to change the offset adjustment signal Adj supplied to the dummy load 4 of this sense amplifier 1. The dummy load 4 is maintained at the first capacitance value.

On the other hand, if the random offset component of a sense amplifier 1 is on the minus side as a result of the manufacturing, the offset voltage thereof is outside the range between the first average offset value (−30 mV) and the second average offset value (+30 mV). In this case, the offset adjustment signal Adj supplied to the dummy load 4 of this sense amplifier 1 is changed to "Enable" and thus the dummy load 4 switches from the first capacitance value to the second capacitance value. Consequently, the offset voltage is greatly adjusted toward the plus side and shifted to within the above-mentioned range. That is to say, the offset voltage of this sense amplifier 1 is greatly reduced.

In this manner, the offset voltage is controlled with respect to each sense amplifier 1, depending on the manufactured offset voltage. As a result, a variation range of the resultant offset voltage can be reduced as compared with the conventional technique.

Comparative Example

Figure 8:
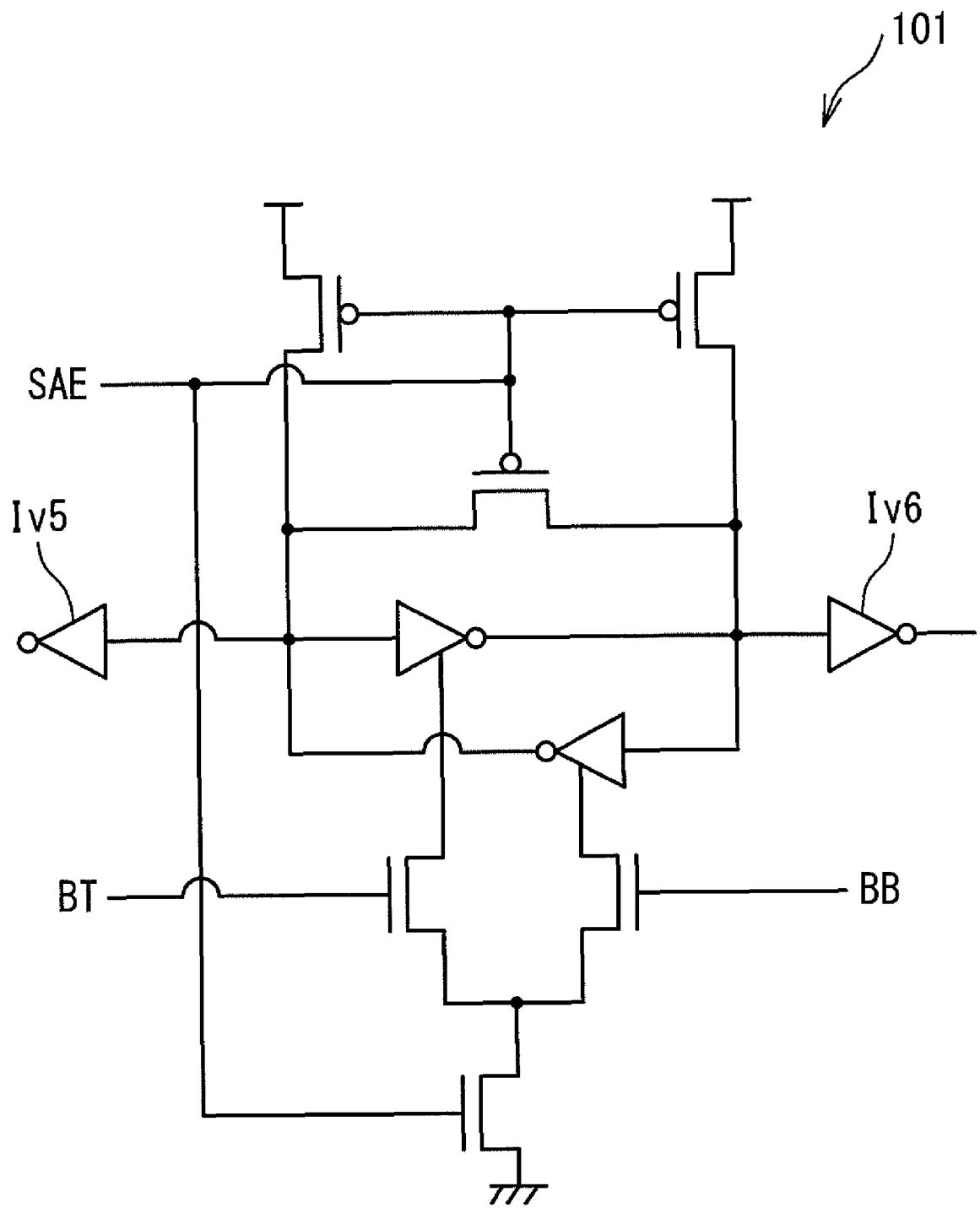
FIG. 8 is a circuit diagram showing a comparative example of a sense amplifier.

FIG. 8 is a circuit diagram showing a comparative example of a sense amplifier. The circuit shown in FIG. 8 has a similar configuration to that of the sense amplifier 101 shown in FIG. 1. The sense amplifier 101 has the inverter Iv6 and the inverter Iv5. The output of the inverter Iv5 is Open without being connected to anything. In the sense amplifier 101, the inverter Iv5 and the inverter Iv6 each has a CMOS configuration in which a PMOS transistor and a NMOS transistor are connected in series. The inverter Iv5 and the inverter Iv6 are designed to be identical to each other and constituted by the same semiconductor elements. Thus, a gate-drain coupling capacitance in the inverter Iv5 is substantially equal to that in the inverter Iv6. In this manner, imbalance in the coupling capacitance between the data output terminal of the sense amplifier 101 and the load-side output is reduced.

Figure 9:
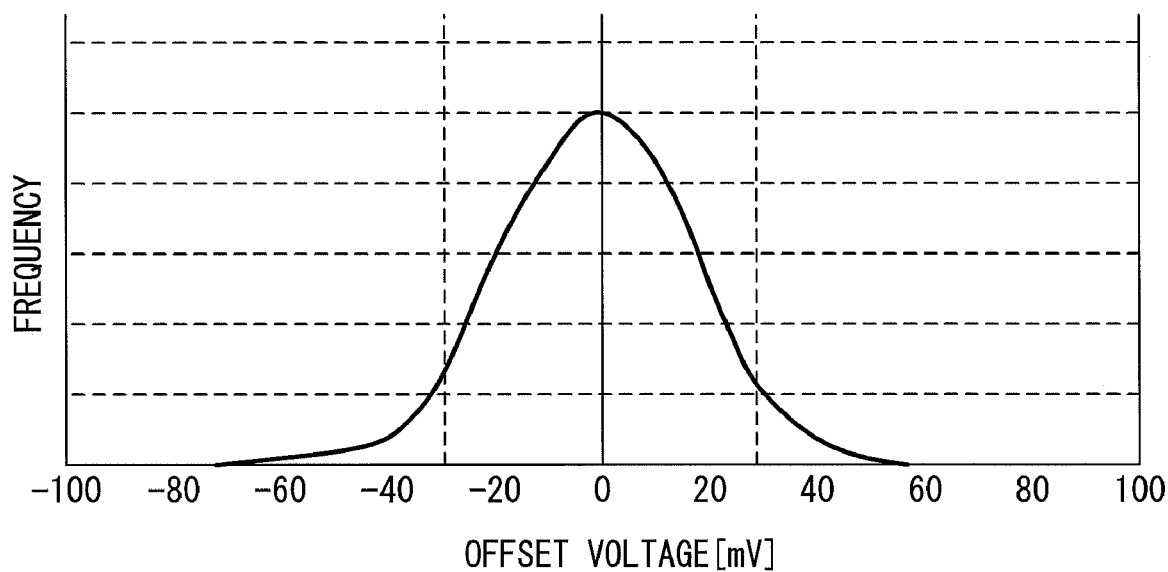
FIG. 9 is a graph showing an example of a distribution of offset voltages for the sense amplifiers shown in FIG. 8.

FIG. 9 is a graph showing an example of a distribution of the offset voltages for the sense amplifiers 101 shown in FIG. 8. As shown in FIG. 9, the offset voltage can vary for about ±60 mV around 0 mV in the case of the sense amplifier 101. Therefore, some sense amplifiers 101 have a large offset voltage (e.g. +40 mV) outside of the range from −30 mV to +30 mV.

Second Embodiment

Figure 10:
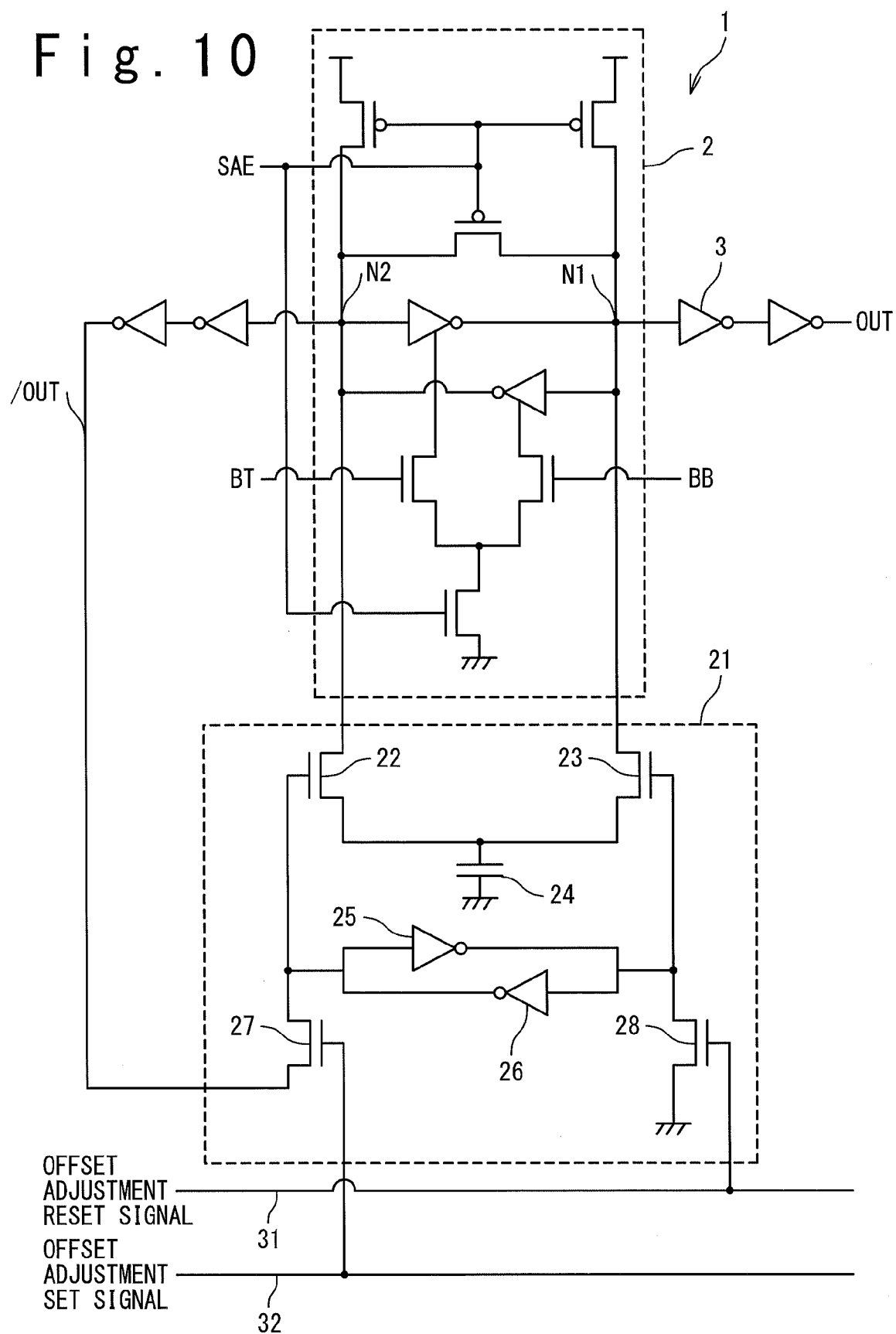
FIG. 10 is a circuit diagram showing a configuration example of a sense amplifier according to a second embodiment of the present invention.

A second embodiment of the present invention will be described below. FIG. 10 is a circuit diagram showing a configuration example of a sense amplifier according to the second embodiment. The sense amplifier 1 in the second embodiment includes a control circuit 21. The control circuit 21 has functions of determining whether to set the offset adjustment signal Adj to "Disable" or "Enable", retaining the determined offset adjustment signal Adj, and supplying the offset adjustment signal Adj to the dummy load 4.

As shown in FIG. 10, the control circuit 21 includes a NMOS transistor 22, a NMOS transistor 23, a capacitor 24, an inverter 25, an inverter 26, an offset set transistor 27 and an offset reset transistor 28. The capacitor 24 and the NMOS transistor 22 or the NMOS transistor 23 corresponds to and functions as the above-mentioned dummy load 4. The inverter 25 and the inverter 26 constitute a latch circuit to retain a data corresponding to the offset adjustment signal Adj. The first node N1 is connected not only to the output terminal OUT through the output circuit 3 but also to a source/drain of the NMOS transistor 23. The second node N2 is connected not only to an output terminal /OUT through an output circuit having the same configuration as the output circuit 3 but also to a source/drain of the NMOS transistor 22. The output terminal /OUT is connected to a source/drain of the offset set transistor 27. A gate of the offset set transistor 27 is connected to a second signal line 32. In response to an offset adjustment set signal supplied through the second signal line 32, the offset set transistor 27 transfers a data output at the output terminal/OUT to the latch circuit of the control circuit 21. A gate of the offset reset transistor 28 is connected to a first signal line 31. In response to an offset adjustment reset signal supplied through the first signal line 31, the offset reset transistor 28 resets the data retained by the latch circuit of the control circuit 21.

In order to determine the offset adjustment signal Adj for each sense amplifier 1, the offset adjustment reset signal is first supplied through the first signal line 31 that is connected in common to all the sense amplifiers 1, before the semiconductor memory device provided with the sense amplifiers 1 is used. The offset reset transistor 28 is activated in response to the offset adjustment reset signal, and thereby the data retained by the latch circuit of the control circuit 21 is cleared (reset) to "0". Next, a "0 read operation" where the data "0" is to be output to the output terminal OUT of the output circuit 3 is performed while the offset adjustment set signal is supplied to the second signal line 32 to activate the offset set transistor 27. If the "0 read operation" results in FAIL, namely, if the data "1" is output to the output terminal OUT, the inverted data "0" is output to the other output terminal /OUT. The data "0" is transferred to the latch circuit of the control circuit 21 through the activated offset set transistor 27, and thereby the latch state of the control circuit 21 is inverted. On the other hand, if the "0 read operation" is normally completed, namely, if the data "0" is output to the output terminal OUT, the inverted data "1" is output to the other output terminal/OUT. This does not change the latch state of the control circuit 21. In this manner, the latch state of the control circuit 21 of each sense amplifier 1 that fails in reading due to the large offset is selectively and automatically inverted. Thus, the latch state corresponding to the offset adjustment signal Adj can be easily determined for each sense amplifier 1. After the latch state of the control circuit 21 is determined, the semiconductor memory device is used normally.

As described above, the sense amplifier 1 in the second embodiment has the control circuit 21, which facilitates the setting and retention of an adjustment bit (offset adjustment signal Adj). In other words, the sense amplifier 1 in the second embodiment can complete the offset adjustment for all the sense amplifiers 1 even with a small additional circuit in accordance with a simple procedure and retain the respective adjustment bits in itself. Moreover, the control circuit 21 of the sense amplifier 1 in the second embodiment has a symmetric configuration and thus layout imbalance is not caused, which can achieve a stable sense amplifier in terms of manufacturing.

It should be noted that the control circuit 21 for setting and retaining the offset adjustment signal Adj is placed within the sense amplifier 1 in the case of FIG. 10. However, the present invention is not limited to such a placement of the control circuit 21. The setting and retention of the offset adjustment signal Adj can be performed externally. For example, the offset adjustment signal Adj may be fixed by using a fuse circuit after the semiconductor chip is manufactured. The offset adjustment signal Adj may be stored in a nonvolatile memory, read out at a time of usage and then set to the sense amplifier 1. The offset adjustment signal Adj may be supplied from an external ROM or a high-order system (BIOS, OS and so on). The offset adjustment signal Adj may be given during a routine of a self-test program at a time of system start-up.

It is apparent that the present invention is not limited to the above embodiments and may be modified and changed without departing from the scope and spirit of the invention.

What is claimed is:

1. A sense amplifier comprising:
a differential amplifier circuit configured to generate an amplified signal depending on a difference in voltage between a first input signal and a second input signal;
an output circuit connected to said differential amplifier circuit and receiving said amplified signal; and
a load connected to said differential amplifier circuit,
wherein said differential amplifier circuit comprises:
a first output node supplying said amplified signal to said output circuit; and
a second output node symmetrically placed with respect to said first output node and connected to said load,
wherein said output circuit comprises an output terminal for outputting an output signal generated based on said amplified signal, and
wherein said load is configured to switch between a first capacitance value with which an offset voltage at said output terminal becomes a first voltage and a second capacitance value with which said offset voltage becomes a second voltage and to shift said offset voltage from said first voltage to said second voltage by switching from said first capacitance value to said second capacitance value in response to a control signal.

2. The sense amplifier according to claim 1,
wherein an average value of a distribution of said first voltage for a plurality of the sense amplifiers is a first average offset value,
an average value of a distribution of said second voltage for said plurality of the sense amplifiers is a second average offset value,
a difference between said second average offset value and said first average offset value is an offset correction voltage, and
said load is configured to switch between said first capacitance value and said second capacitance value such that a difference between said first voltage and said second voltage is equal to said offset correction voltage.

3. The sense amplifier according to claim 2,
wherein said control signal supplied to said load is activated if said offset voltage is outside a range between said first average offset value and said second average offset value, and
said load switches from said first capacitance value to said second capacitance value in response to said control signal to shift said offset voltage from outside said range to within said range.

4. The sense amplifier according to claim 2,
wherein said load is maintained at said first capacitance value if said offset voltage is within a range between said first average offset value and said second average offset value.

5. The sense amplifier according to claim 2,
wherein said first average offset value and said second average offset value are symmetric with respect to 0.

6. The sense amplifier according to claim 1,
wherein said differential amplifier circuit has a symmetric property, and said load and said output circuit are designed to be asymmetric with each other.

7. A semiconductor memory device comprising:
a plurality of memory cells; and
a sense amplifier configured to amplify a signal read out from at least one of said plurality of memory cells,
wherein said sense amplifier comprises:
a differential amplifier circuit configured to generate an amplified signal depending on a difference in voltage between a first input signal and a second input signal;
an output circuit connected to said differential amplifier circuit and receiving said amplified signal; and
a load connected to said differential amplifier circuit,
wherein said differential amplifier circuit comprises:
a first output node supplying said amplified signal to said output circuit; and
a second output node symmetrically placed with respect to said first output node and connected to said load,
wherein said output circuit comprises an output terminal for outputting an output signal generated based on said amplified signal, and
wherein said load is configured to switch between a first capacitance value with which an offset voltage at said output terminal becomes a first voltage and a second capacitance value with which said offset voltage becomes a second voltage and to shift said offset voltage from said first voltage to said second voltage by switching from said first capacitance value to said second capacitance value in response to a control signal.

8. The semiconductor memory device according to claim 7, wherein an average value of a distribution of said first voltage for a plurality of the sense amplifiers is a first average offset value, an average value of a distribution of said second voltage for said plurality of the sense amplifiers is a second average offset value, a difference between said first average offset value and said second average offset value is an offset correction voltage, and said load is configured to switch between said first capacitance value and said second capacitance value such that a difference between said first voltage and said second voltage is equal to said offset correction voltage.

9. The semiconductor memory device according to claim 8, further comprising a control circuit configured to supply said control signal to said load, wherein said control circuit activates said control signal if said offset voltage is outside a range between said first average offset value and said second average offset value, and wherein said load switches from said first capacitance value to said second capacitance value in response to said control signal to shift said offset voltage from outside said range to within said range.

* * * * *